(12) United States Patent
Hong

(10) Patent No.: US 9,000,510 B2
(45) Date of Patent: Apr. 7, 2015

(54) NONVOLATILE MEMORY DEVICE WITH UPPER SOURCE PLANE AND BURIED BIT LINE

(75) Inventor: Young-Ok Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 89 days.

(21) Appl. No.: 13/608,652

(22) Filed: Sep. 10, 2012

(65) Prior Publication Data

US 2013/0168757 A1 Jul. 4, 2013

(30) Foreign Application Priority Data

Dec. 28, 2011 (KR) ........................ 10-2011-0145057

(51) Int. Cl.
*H01L 29/792* (2006.01)
*H01L 27/115* (2006.01)

(52) U.S. Cl.
CPC ...... *H01L 27/11582* (2013.01); *H01L 29/7926* (2013.01)

(58) Field of Classification Search
CPC ...................... H01L 27/11582; H01L 29/7926
USPC ........................... 257/324, E29.309, E21.423
See application file for complete search history.

(56) References Cited

U.S. PATENT DOCUMENTS

| | | | |
|---|---|---|---|
| 2011/0002178 A1* | 1/2011 | Hwang et al. | 365/189.011 |
| 2011/0286283 A1* | 11/2011 | Lung et al. | 365/185.28 |
| 2012/0139027 A1* | 6/2012 | Son et al. | 257/324 |
| 2012/0182808 A1* | 7/2012 | Lue et al. | 365/185.18 |

* cited by examiner

*Primary Examiner* — Eva Y Montalvo
*Assistant Examiner* — John P Dulka
(74) *Attorney, Agent, or Firm* — IP&T Group LLP

(57) ABSTRACT

A nonvolatile memory device includes: a channel layer extending in a vertical direction from a substrate; a plurality of interlayer dielectric layers and word lines alternately stacked along the channel layer over the substrate; a bit line formed under plurality of interlayer dielectric layers and word lines, coupled to the channel layer, and extending in a direction crossing the word lines; and a common source layer coupled to the channel layer and formed over the plurality of interlayer dielectric layers and word lines.

8 Claims, 10 Drawing Sheets

NONVOLATILE MEMORY DEVICE WITH UPPER SOURCE PLANE AND BURIED BIT LINE

CROSS-REFERENCE TO RELATED APPLICATIONS

The present application claims priority of Korean Patent Application No. 10-2011-0145057, filed on Dec. 28, 2011, which is incorporated herein by reference in its entirety.

BACKGROUND

1. Field

Exemplary embodiments of the present invention relate to a nonvolatile memory device and a method for fabricating the same, and more particularly, to a nonvolatile memory device having a three-dimensional (3D) structure including a plurality of memory cells that are vertically stacked from a substrate and a method for fabricating the same.

2. Description of the Related Art

A nonvolatile memory device is a memory device that maintains data stored therein even though power supply is cut off. Various nonvolatile memory devices, for example, a flash memory and so on are examples of a nonvolatile memory device.

The improvement in integration degree of a nonvolatile memory device having a two-dimensional (2D) structure that includes memory cells that are formed in a single layer over a semiconductor device has approached a limit. Accordingly, a nonvolatile memory device having a 3D structure has been proposed. The nonvolatile memory device having a 3D structure includes a plurality of memory cells that are formed along a channel layer extending vertically from a semiconductor substrate. More specifically, the nonvolatile memory device having a 3D structure may be divided into a structure having a line-shaped channel layer and a structure having a U-shaped channel layer.

In the structure having a line-shaped channel layer, the fabrication process thereof is relatively simple. However, since a source line is formed by ion implanting impurities into a silicon substrate, a doping profile is changed by a subsequent heat treatment or the like, thereby increasing source resistance. In addition, a method that forms a source line of a conductive material such as a metal to reduce resistance has been proposed. In this method, however, the doping profile of a source area under the channel layer may be difficult to control. Accordingly, since a gate induced drain leakage (GIDL) current is not sufficiently secured, an erase operation may not be performed normally.

Alternatively, the structure having a U-shaped channel layer may solve the above-described problem. However, the fabrication process thereof is complex. Furthermore, as the channel length is increased, a cell current is reduced.

SUMMARY

An embodiment of the present invention is directed to a nonvolatile memory device for improving the erase characteristic and reducing source resistance, and a method for fabricating the same.

In accordance with an embodiment of the present invention, a nonvolatile memory device includes: a channel layer extending in a vertical direction from a substrate; a plurality of interlayer dielectric layers and word lines alternately stacked along the channel layer over the substrate; a bit line formed under plurality of interlayer dielectric layers and word lines, coupled to the channel layer, and extending in a direction crossing the word lines; and a common source layer coupled to the channel layer and formed over the plurality of interlayer dielectric layers and word lines.

In accordance with another embodiment of the present invention, a method for fabricating a nonvolatile memory device includes: forming a plurality of bit lines extending in a first direction over a substrate; forming a sacrificial layer in a space between the bit lines; alternately stacking a plurality of first material layers and second material layers over the bit line and the sacrificial layer; forming a plurality of holes that expose the bit lines by selectively etching the first and second material layers; forming a channel layer inside the holes; forming a plurality of trenches that extend in a second direction by etching the first and second material layers between the plurality of holes; and forming a common source layer over the plurality of first material layers and second material layers coupled to the channel layer.

DETAILED DESCRIPTION

Figure 1A:
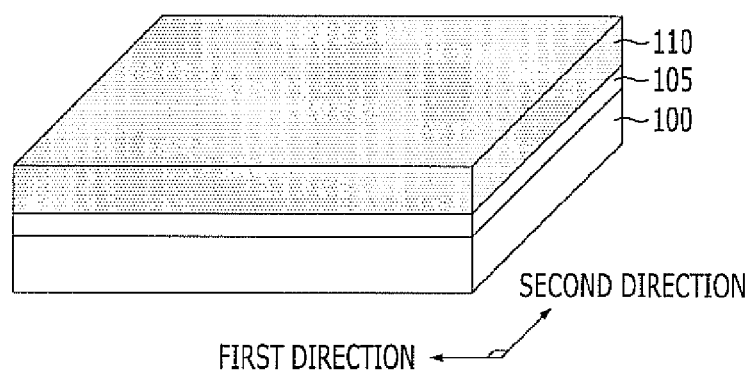
FIGS. 1A to 1J are perspective views illustrating a nonvolatile memory device and a method for fabricating the same in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
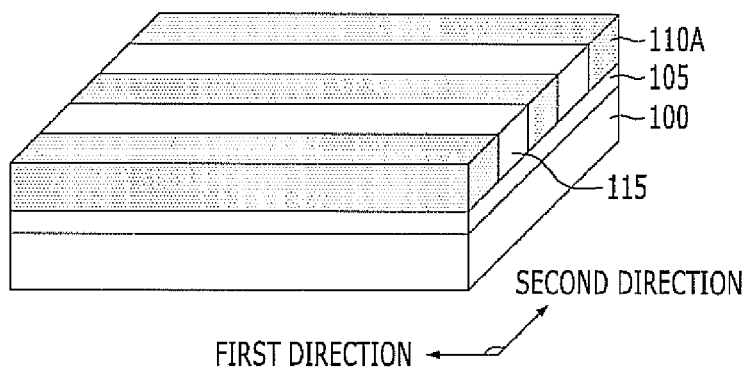
Figure 1C:
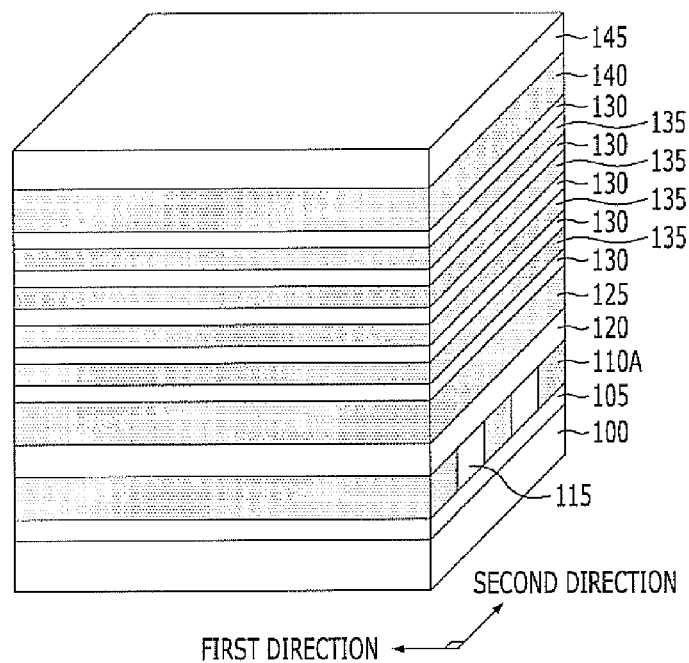
Figure 1D:
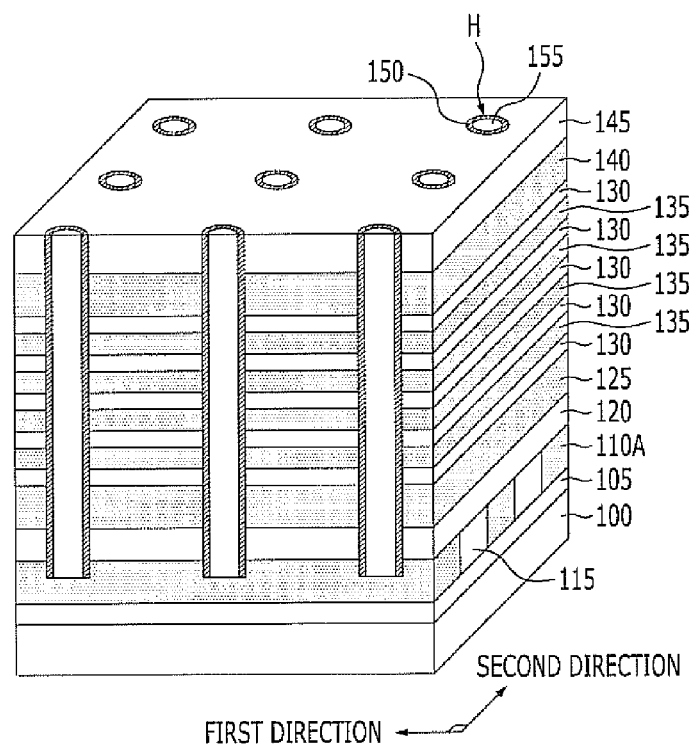
Figure 1E:
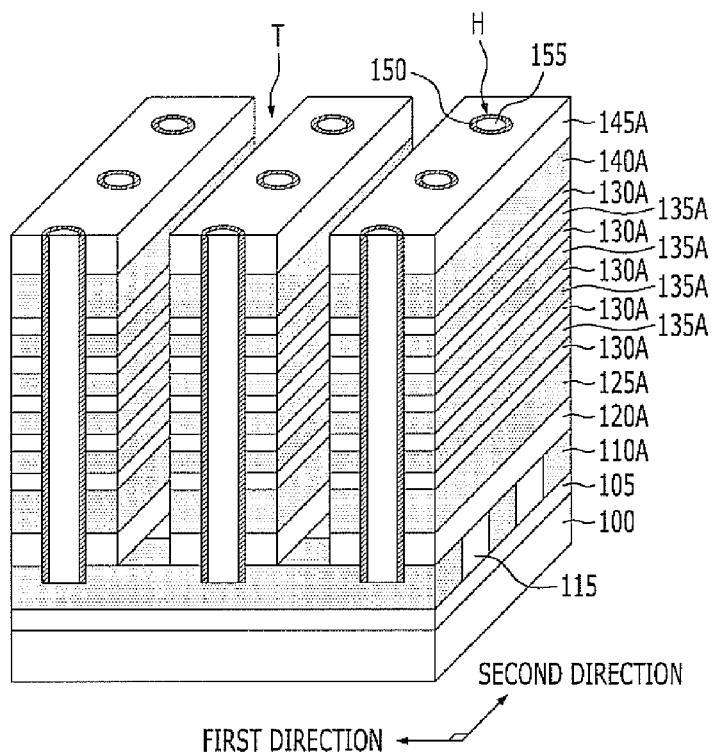
Figure 1F:
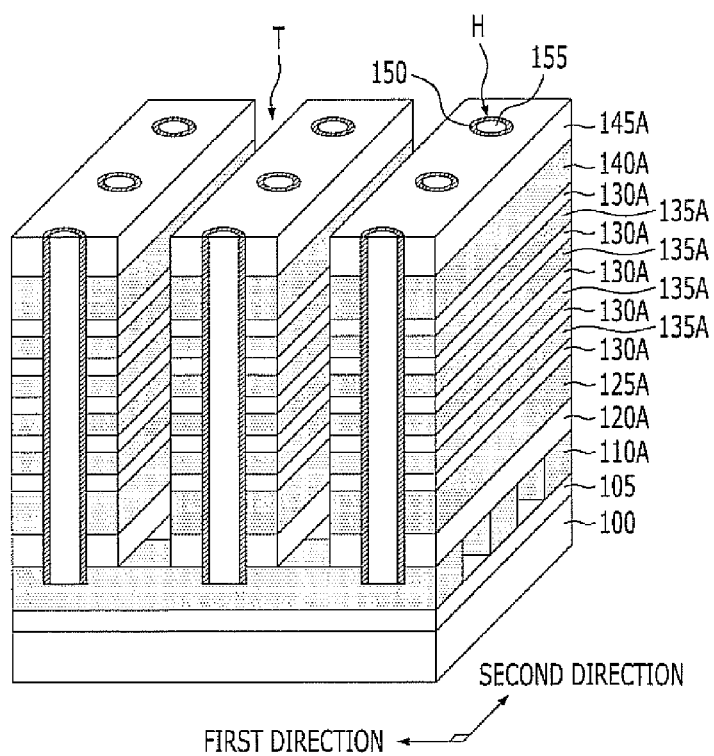
Figure 1G:
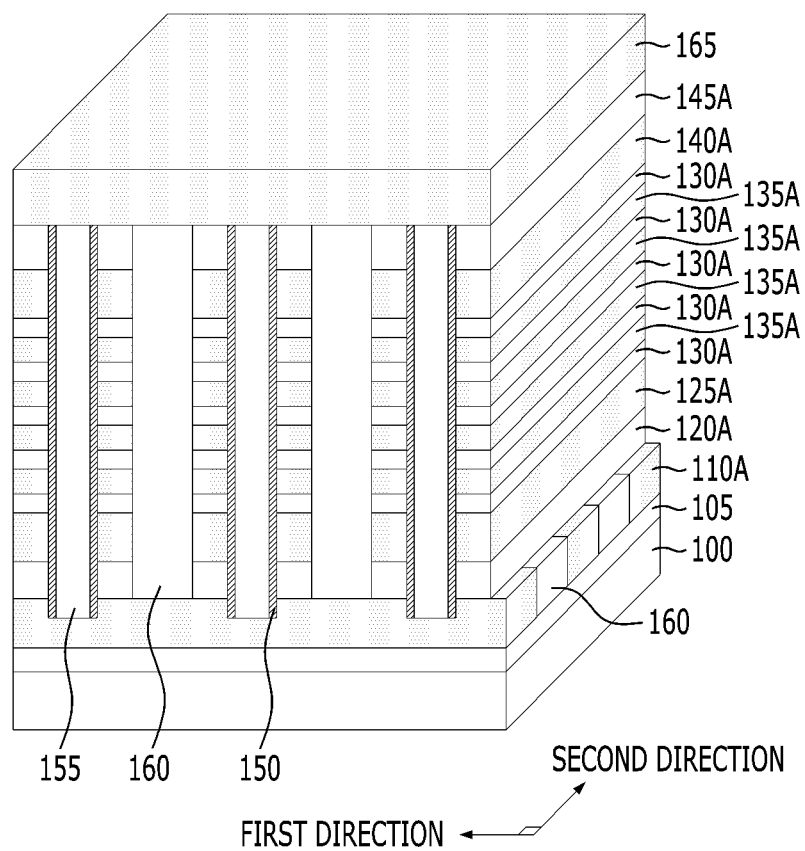
Figure 1H:
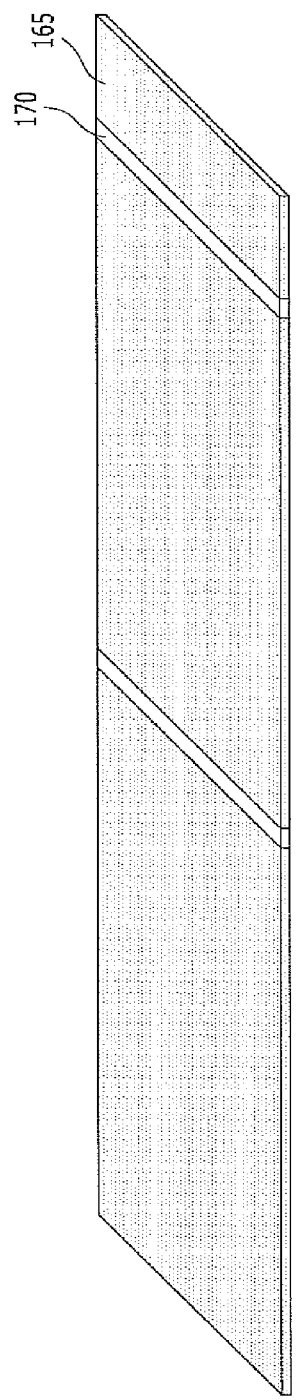
Figure 1I:
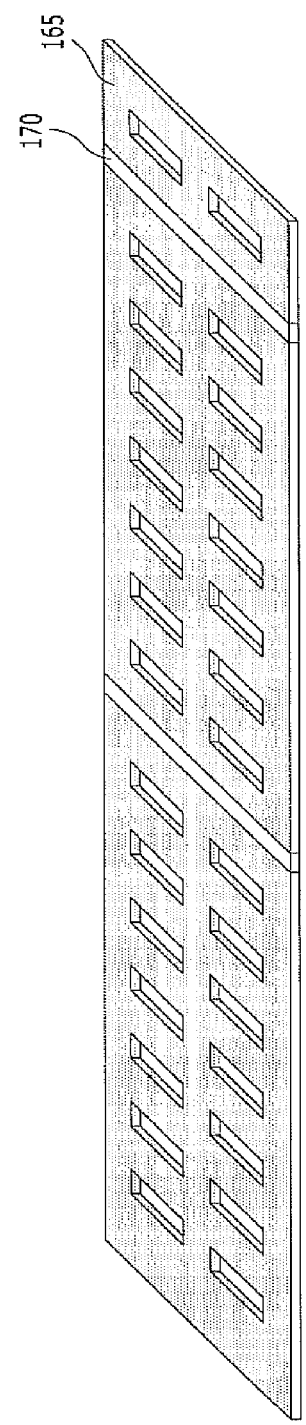
Figure 1J:
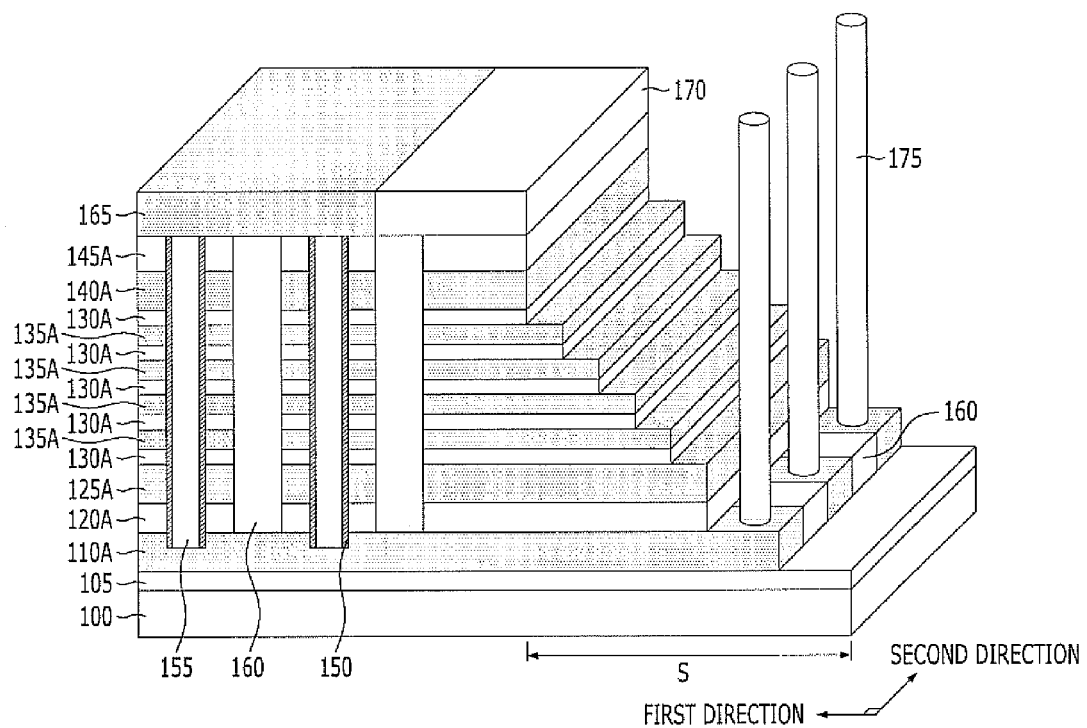

FIGS. 1A to 1J are perspective views illustrating a nonvolatile memory device and a method for fabricating the same in accordance with a first embodiment of the present invention. In particular, FIG. 1J is a perspective view of the nonvolatile memory device in accordance with the first embodiment of the present invention, and FIGS. 1A to 1I are perspective views illustrating intermediate processes of the method for fabricating the nonvolatile memory device of FIG. 1J.

Referring to FIG. 1A, a first interlayer dielectric layer 105 is formed over a substrate 100, and a bit line conductive layer 110 is formed over the first interlayer dielectric layer 105.

Here, the substrate 100 may include a semiconductor substrate such as single crystal silicon, and the first interlayer dielectric layer 105 is formed of a material having an etching selectivity with a sacrificial layer, which will be subsequently formed as described below. For example, the first interlayer dielectric layer 105 may be formed of an oxide-based material. Furthermore, the bit line conductive layer 110 may be formed of a conductive material, for example, polysilicon.

Referring to FIG. 1B, a line-shaped mask pattern (not illustrated) extending in a first direction is formed over the bit line conductive layer 110, and a plurality of bit lines 110A are formed by etching the bit line conductive layer 110 using the mask pattern as an etch mask. The plurality of bit lines 110A may be arranged in parallel to each other.

A sacrificial layer 115 is formed in a space between the bit lines 110A. The sacrificial layer 115 is formed of a material having an etching selectivity with the first interlayer dielectric layer 105 and second to fourth interlayer dielectric layers, which will be described below. For example, the sacrificial layer 115 may be formed of a nitride-based material.

Referring to FIG. 1C, a second interlayer dielectric layer 120 is formed over the bit lines 110A and the sacrificial layers 115, and a lower select line conductive layer 125 is formed over the second interlayer dielectric layer 120.

Here, the second interlayer dielectric layer 120 is formed of a material having an etching selectivity with the sacrificial layer 115. For example, the second interlayer dielectric layer 120 may be formed of an oxide-based material. Furthermore, the lower select line conductive layer 125 may be formed of a conductive material, for example, polysilicon.

A plurality of third interlayer dielectric layers 130 and a plurality of word line conductive layers 135 are alternately stacked over the lower select line conductive layer 125.

The third interlayer dielectric layers 130 are formed of a material having an etching selectivity with the sacrificial layer 115. For example, the third interlayer dielectric layers 130 are formed of an oxide-based material. Furthermore, the word line conductive layer 135 is formed of a conductive material, for example, polysilicon. In FIG. 1C, four word line conductive layers 135 are illustrated. However, this is only an example, and the number of word line conductive layers may be set to more than four or less than four.

An upper select line conductive layer 140 is formed over the third interlayer dielectric layers 130, and a fourth interlayer dielectric layer 145 is formed over the upper select line conductive layer 140.

Here, the upper select line conductive layer 140 may be formed of a conductive material, for example, polysilicon. Furthermore, the fourth interlayer dielectric layer 145 may be formed of a material having an etching selectivity with the sacrificial layer 115. For example, the fourth interlayer dielectric layer 145 may be formed of an oxide-based material.

Referring to FIG. 1D, the structure including the second interlayer dielectric layer 120, the lower select line conductive layer 125, the plurality of third interlayer dielectric layer 130, the plurality of word line conductive layers 135, the upper select line conductive layer 140, and the fourth interlayer dielectric layer 145 (hereafter, referred to as 'first stacked structure') is selectively etched to form a plurality of holes H exposing the bit lines 110A. The plurality of holes H may have a circular or elliptical shape when seen from the top and may be arranged in a matrix shape.

A memory layer 150 is formed on a sidewall of each hole H, and a channel layer 155 is formed in the hole H having the memory layer 150 formed on the sidewalls of the hole H.

The memory layer 150 may be formed by sequentially depositing a charge blocking layer, a charge trap layer, and a tunnel insulation layer. The tunnel insulation tunnels charges and, for example, may be formed of oxide. The charge trap layer traps charges to store data, and, for example, may be formed of nitride. The charge blocking layer blocks the charges within the charge trap layer from moving, and, for example, may be formed of oxide. More specifically, the memory layer 150 may have a triple-layer structure of oxide-nitride-oxide (ONO).

The channel layer 155 may be formed of a semiconductor material, for example, polysilicon. In this embodiment of the present invention, the channel layer 155 may be formed to completely fill the hole H, but the present invention is not limited thereto. In another embodiment, the channel layer 155 may be formed not to completely fill the hole H.

Referring to FIG. 1E, the first stacked structure is selectively etched to form a plurality of trenches T exposing the bit lines 110A and the sacrificial layers 115. The trenches may be formed between the plurality of holes H. The plurality of trenches T may be extended in a second direction and arranged in parallel to each other.

As the result of this process, a lower select line 125A, a plurality of word lines 135A, and an upper select line 140A are formed to extend in the second direction while surrounding the memory layer 150 and the channel layer 155. The remaining second to fourth interlayer dielectric layers 120, 130, and 145 are referred to as second to fourth interlayer dielectric layer patterns 120A, 130A, and 145A, respectively.

Referring to FIG. 1F, the sacrificial layers 115 are removed by using the etching selectivity with the first to fourth interlayer dielectric layer patterns 105, 120A, 130A, and 145A. A wet etching process such as a wet dip-out process may be performed to remove the sacrificial layers 115. As the result of this process, the side surface of the bit line 110A may be exposed to promote silicidation of the bit line 110A during the subsequent process.

A silicidation process is performed to silicidize the bit line 110A, the lower select line 125A, the plurality of word lines 135A, and the upper select line 140A. Specifically, the silicidation process may be performed by the following process.

First, a metal such as cobalt (Co), nickel (Ni), or titanium (Ti) is deposited inside each of the trenches T, and a heat treatment such as rapid thermal annealing (RTA) is performed. As the result of the heat treatment, a part or all of polysilicon included in the bit line 110A, the lower select line 125A, the plurality of word lines 135A, and the upper select line 140A may be silicidized and converted into a metal silicide such as $CoSi_x$, $NiSi_x$, or $TiSi_x$. Accordingly, the resistances of the bit line 110A, the lower select line 125A, the plurality of word lines 135A, and the upper select line 140A are reduced.

A strip process is subsequently performed to remove the metal that does not react during the heat treatment. In order to remove the remaining metal, a mixed solution of $H_2SO_4$ and $H_2O_2$, more specifically, sulfuric acid and hydro-peroxide mixture (SPM), may be used. Meanwhile, a heat treatment may be additionally performed after the strip process.

Referring to FIGS. 1G to 1I, the trench T is filled with a first insulation layer 160, and a source area (not illustrated) is formed at the top of the channel layer 155.

Here, the first insulation layer 160 may be formed of an oxide or nitride-based material, and the source area may be formed by doping impurities through an ion implant process. In particular, as the source area is formed at the top of the channel layer 155, the doping profile may be controlled, and the change of the doping profile may be prevented. Accordingly, a GIDL current may be sufficiently secured, which improves the erase characteristic of the nonvolatile memory device.

A common source layer 165 is formed over the resultant structure including the channel layer 155 to be coupled to the top of the channel layer 155.

Here, the common source layer 165 is formed of a conductive layer, for example, a metal having low specific resistance. In this embodiment, the common source layer 165 may be formed in a plate shape as illustrated in FIG. 1H, or may be formed in a mesh shape as illustrated in FIG. 1I. In particular, when the common source layer 165 is formed in a mesh shape, dishing, which may occur during a subsequent chemical mechanical polishing (CMP) process, may be decreased.

Slits are formed to separate the common source layer 165 into unit blocks, and the slits are filled with a second insulation layer 170. The second insulation layer 170 may be formed of an oxide or nitride-based material.

Referring to FIG. 1J, a slimming process is performed to form a stepped contact area S for coupling the bit line 110A, the lower select line 125A, the plurality of word lines 135A, and the upper select line 140A to peripheral circuits.

A bit line contact plug 175 is formed to extend in a vertical direction from the substrate 100, and the bit line contact plug 175 is coupled to the bit line 110A.

Here, the bit line contact plug 175 may be formed by the following process: an insulation layer (not illustrated) is formed over the stepped contact area S, and the insulation layer is selectively etched to form a hole (not illustrated) exposing the bit line 110A, and a conductive material is buried in the hole.

The nonvolatile memory device in accordance with the first embodiment of the present invention, as illustrated in FIG. 1J, may be fabricated by the above-described fabrication method.

Referring to FIG. 1J, the nonvolatile memory device in accordance with the first embodiment of the present invention may include the channel layer 155, which extends in a vertical direction from the substrate 100, the plurality of interlayer dielectric layer patterns and conductive layers, which are alternately stacked along the channel layer 150, the bit line 110A, which extends in a direction crossing the conductive lines and is coupled to the bottom of the channel layer 155, the common source layer 165, which is coupled to the top of the channel layer 155, the memory layer 150, which is interposed between the channel layer 155 and the conductive lines, and the bit line contact plug 175, which extends in the same direction as the channel layer 155 and is coupled to the bit line 110A.

Here, the plurality of conductive lines may include the upper select line 140A, which are positioned at the uppermost part, the lower select line 125A, which are positioned at the lowermost part, and the plurality of word lines 135A, which are positioned between the upper select line 140A and the lower select line 125A.

Furthermore, the bit line 110A may include polysilicon or metal silicide, and the common source layer 165 may include a metal and may be formed in a plate or mesh shape separated into unit blocks.

FIGS. 2A to 2F are perspective views illustrating a nonvolatile memory device and a method for fabricating the same in accordance with a second embodiment of the present invention. In this embodiment of the present invention, the detailed descriptions of the same components as those of the first embodiment of the present invention are omitted. First, the processes of FIGS. 1A and 1B are performed in the same manner as the first embodiment of the present invention, and processes of FIGS. 2A to 2F are subsequently performed.

Figure 2A:
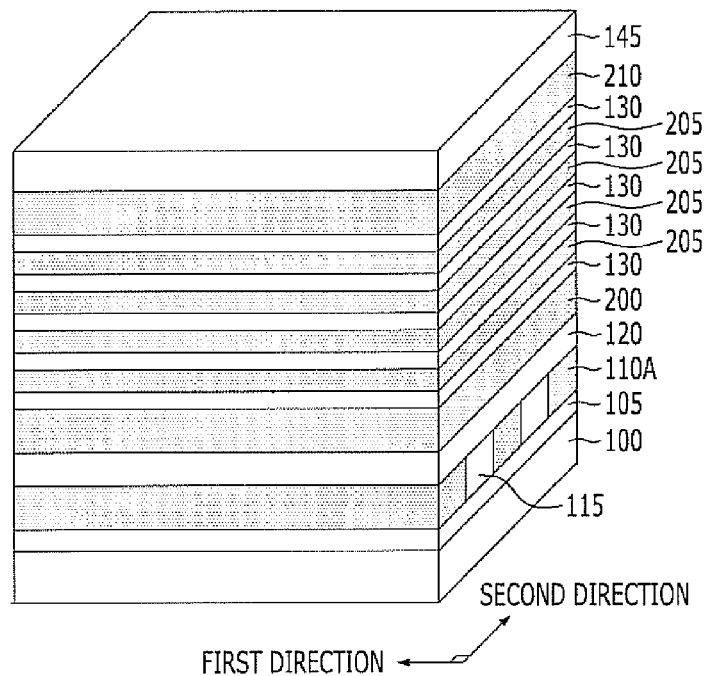
FIGS. 2A to 2F are perspective views illustrating a nonvolatile memory device and a method for fabricating the same in accordance with a second embodiment of the present invention.

Referring to FIG. 2A, a second interlayer dielectric layer 120 is formed over the bit lines 110A and the sacrificial layers 115, and a first sacrificial layer 200 is formed over the second interlayer dielectric layer 120. The first sacrificial layer 200 is removed during a subsequent process and provides a space where a lower select line is to be formed. The first sacrificial layer 200 may be formed of a material having an etching selectivity with the second to fourth interlayer dielectric layers 120, 130, and 145.

A plurality of third interlayer dielectric layers 130 and second sacrificial layers 205 are alternately stacked over the first sacrificial layer 200. The second sacrificial layers 205 are removed during a subsequent process, and provide spaces where word lines are to be formed. The second sacrificial layers 205 may be formed of a material having an etching selectivity with the second to fourth interlayer dielectric layers 120, 130, and 145.

A third sacrificial layer 210 is formed over the third interlayer dielectric layers 130, and a fourth interlayer dielectric layer 145 is formed over the third sacrificial layer 210. The third sacrificial layer 210 is removed during a subsequent process, and provides a space where an upper select line is to be formed. The third sacrificial layer 210 may be formed of a material having an etching selectivity with the second to fourth interlayer dielectric layers 120, 130, and 145.

Figure 2B:
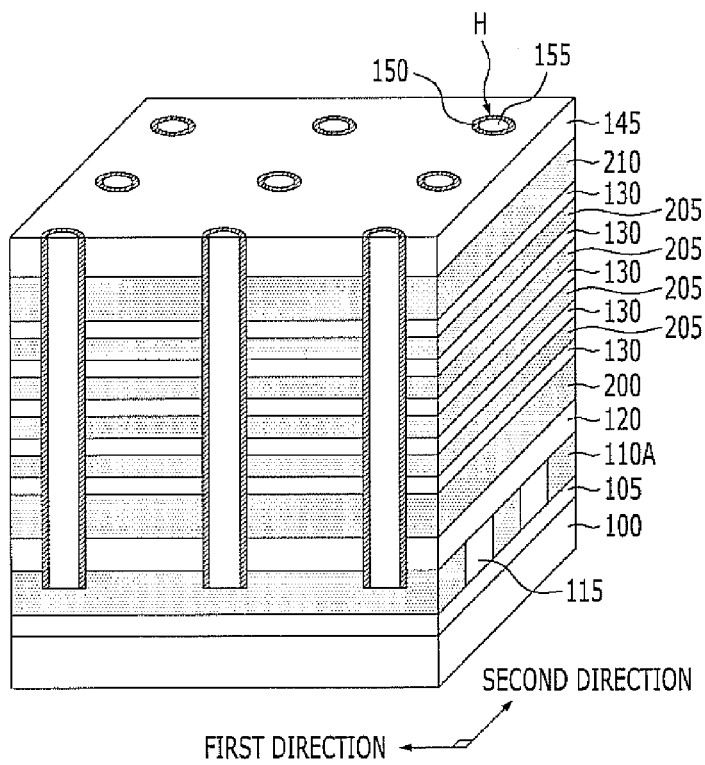

Referring to FIG. 2B, the structure including the second interlayer dielectric layer 120, the first sacrificial layer 200, the plurality of third interlayer dielectric layers 130, the plurality of second sacrificial layers 205, the third sacrificial layer 210, and the fourth interlayer dielectric layer 145 (hereafter, referred to as 'second stacked structure') is selectively etched to form a plurality of holes H.

A memory layer 150 is formed on a sidewall of each hole H, and a channel layer 155 is formed in the hole H having the memory layer 150 formed on the sidewalls of the hole H. The memory layer 150 may be formed by sequentially depositing a charge blocking layer, a charge trap layer, and a tunnel insulation layer. Furthermore, the channel layer 155 may be formed of a semiconductor material, for example, polysilicon.

Figure 2C:
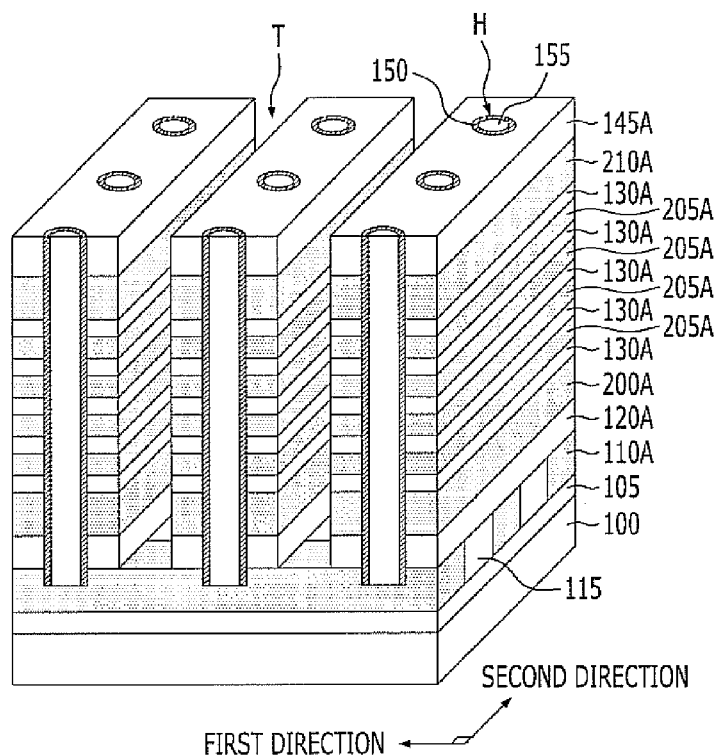

Referring to FIG. 2C, the second stacked structure is selectively etched to form a plurality of trenches T exposing the bit lines 110A and the sacrificial layers 115. The trenches may be formed between the plurality of holes H. As result of this process, first to third sacrificial layer patterns 200A, 205A, and 210A are formed to extend in the second direction while surrounding the memory layer 150 and the channel layer 155, and the remaining second to fourth interlayer dielectric layers 120, 130, and 145 are referred to as second to fourth interlayer dielectric layer patterns 120A, 130A, and 145A.

Figure 2D:
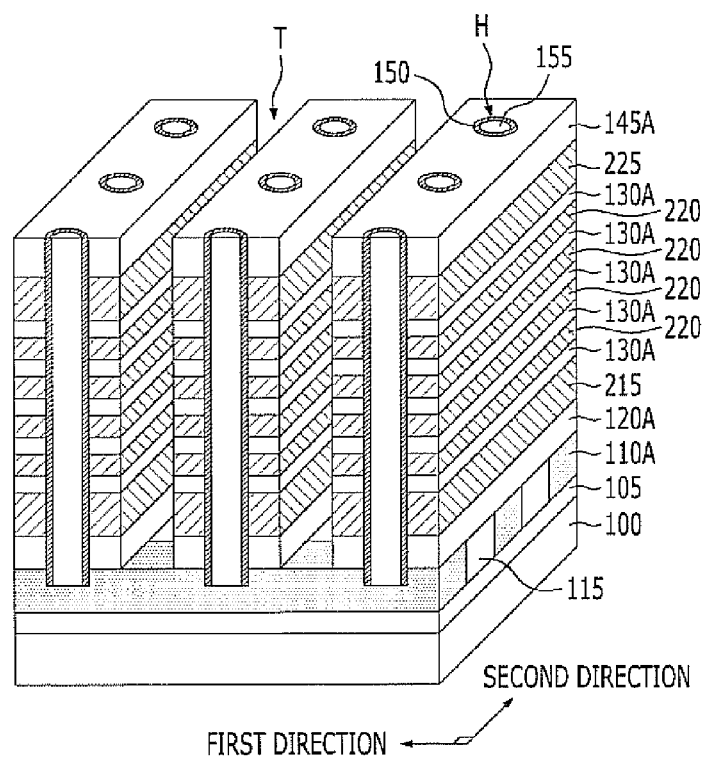

Referring to FIG. 2D, the first to third sacrificial layer patterns 200A, 205A, and 210A exposed through the trenches T are removed. To remove the first to third sacrificial layer patterns 200A, 205A, and 210A, a wet etching process using an etching selectivity with the second to fourth interlayer dielectric layer patterns 120A, 130A, and 145A may be performed.

A lower select line 215, a plurality of word lines 220, and an upper select line 225 are formed in spaces formed by removing the first sacrificial layer pattern 200A, the second sacrificial layer patterns 205A, and the third sacrificial layer pattern 210A, respectively. Specifically, the lower select line 215, the word lines 220, and the upper select line 225 may be formed by the following process.

First, a conductive material, for example, a metal or metal nitride is conformally deposited by chemical vapor deposition (CVD) or atomic layer deposition (ALD) to form a conductive layer (not illustrated) that fills the trenches T and the spaces formed by removing the first to third sacrificial layers 200A, 205A, and 210A. Subsequently, the lower select line 215, the word lines 220, and the upper select lines 225 are formed by etching the conductive layer formed in the trenches T until side surfaces of the second to fourth interlayer dielectric layer patterns 120A, 130A, and 145A are exposed.

Figure 2E:
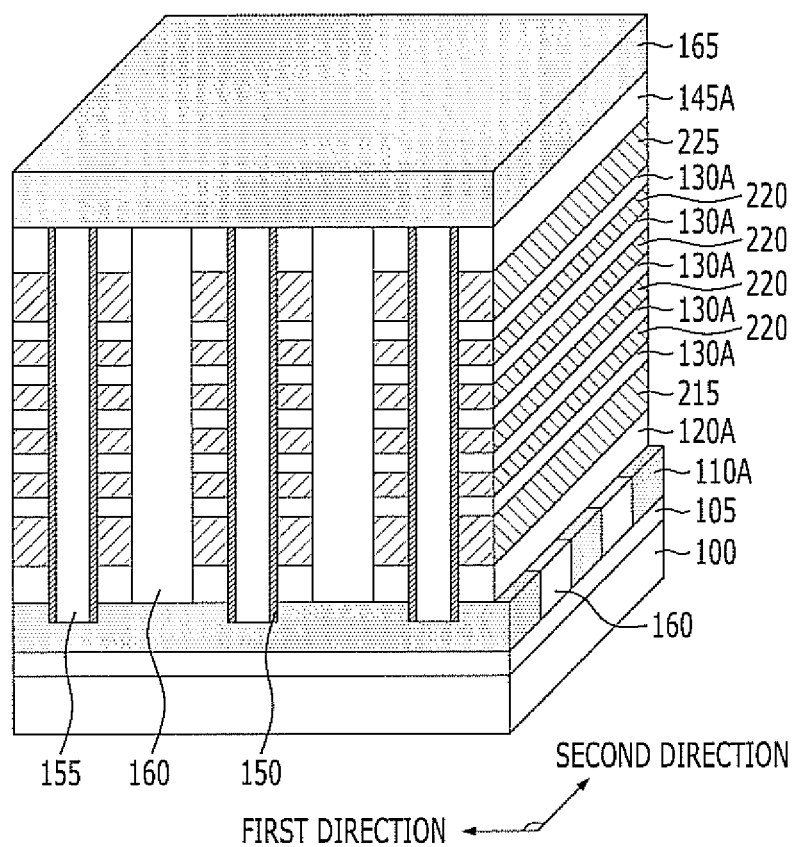

Referring to FIG. 2E, the trenches T1 are filled with a first insulation layer 160, and a source area (not illustrated) is formed at the top of the channel layer 155. The first insulation layer 160 may be formed of an oxide or nitride-based material, and the source area may be formed by doping impurities through an ion implant process or the like.

A common source layer 165 is formed over the resultant structure including the channel layer 155 to be coupled to the top of the channel layer 155. The common source layer 165 may be formed of a conductive material, for example, a metal having low specific resistance.

Figure 2F:
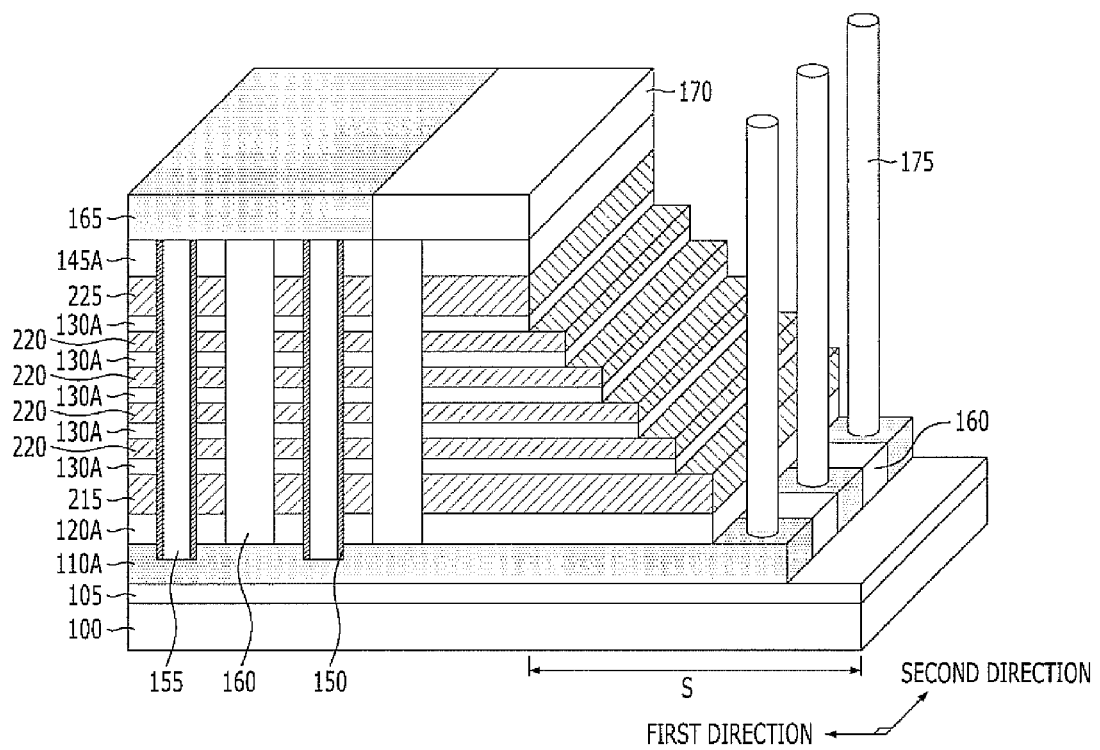

Referring to FIG. 2F, slits for separating the common source layer 165 into unit blocks are formed, and the slits are filled with a second insulation layer 170. The second insulation layer 170 may be formed of an oxide or nitride-based material.

A slimming process is performed to form a stepped contact area S for coupling the bit line 110A, the lower select line 215, the word lines 220, and the upper select line 225 to peripheral circuits. A bit line contact plug 175 is formed to extend in a vertical direction from the substrate 110, and the bit line contact plug 175 is coupled the bit line 110A.

Here, the bit line contact plug 175 may be formed by the following process: an insulation layer (not illustrated) is formed over the stepped contact area 5, and the insulation layer is selectively etched to form a hole (not illustrated) exposing the bit line 110A, and a conductive material is buried in the hole.

The second embodiment of the present invention is different from the first embodiment of the present invention in that the lower select line 215, the word lines 220, and the upper select line 225 are formed in the spaces obtained by removing the first to third sacrificial layer patterns 200A, 205A, and 210A after the second stacked structure is formed.

In accordance with the embodiments of the present invention, as the source area is formed at the top of the channel layer, the doping profile may be controlled, and the change thereof may be prevented. Accordingly, a GIDL current may be sufficiently secured, and the erase characteristic of the nonvolatile memory device may be improved. Furthermore, as the common source layer is formed of a metal without forming the channel layer in a U shape, the source resistance may be reduced.

In accordance with the embodiments of the present invention, the erase characteristic of the nonvolatile memory device may be improved, and the source resistance of the nonvolatile memory device may be reduced.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
 a channel layer extending in a vertical direction from a substrate;
 a plurality of interlayer dielectric layers and word lines alternately stacked along the channel layer over the substrate;
 a bit line formed under a plurality of interlayer dielectric layers and word lines, coupled to the channel layer, and extending in a direction crossing the word lines; and
 a common source layer coupled to the channel layer and formed over the plurality of interlayer dielectric layers and word lines,
 wherein the common source layer is divided into unit blocks by slits which are filled with an insulation layer.

2. The nonvolatile memory device of claim 1, further comprising an interlayer dielectric layer and an upper select line interposed between the word lines and the common source layer.

3. The nonvolatile memory device of claim 1, further comprising an interlayer dielectric layer and a lower select line interposed between the word lines and the bit line.

4. The nonvolatile memory device of claim 1, further comprising a memory layer interposed between the channel layer and the word lines.

5. The nonvolatile memory device of claim 1, further comprising a bit line contact plug coupled to the bit line and extending in the same direction as the channel layer.

6. The nonvolatile memory device of claim 1, wherein the bit line includes polysilicon or metal silicide.

7. The nonvolatile memory device of claim 1, wherein the common source layer includes a metal.

8. The nonvolatile memory device of claim 1, wherein the common source layer has a plate or mesh shape.

* * * * *